United States Patent [19]
Harton

[11] 4,404,459
[45] Sep. 13, 1983

[54] HOUSING AND MOUNTING ASSEMBLY PROVIDING A TEMPERATURE STABILIZED ENVIRONMENT FOR A MICROCIRCUIT

[75] Inventor: Donald L. Harton, Baltimore, Md.

[73] Assignee: The Bendix Corporation, Southfield, Mich.

[21] Appl. No.: 312,589

[22] Filed: Oct. 19, 1981

[51] Int. Cl.³ .............................................. H05B 1/00
[52] U.S. Cl. ...................................... 219/209; 219/405; 219/494; 219/499; 219/501; 307/303; 307/310; 357/29
[58] Field of Search ................... 219/121 LJ, 209, 210, 219/405, 410, 413, 494, 499, 501, 505, 510; 307/300, 310, 303; 357/28, 29, 40

[56] References Cited

U.S. PATENT DOCUMENTS

| | | | |
|---|---|---|---|
| 2,973,420 | 2/1961 | Craiglow et al. | 219/209 X |
| 3,293,540 | 12/1966 | Silard et al. | 307/310 X |
| 3,358,152 | 12/1967 | Alexakis | 307/310 |
| 3,395,265 | 7/1968 | Wair | 219/209 |
| 3,440,407 | 4/1969 | Goltsos et al. | 219/494 |
| 3,444,399 | 5/1969 | Jones | 307/310 |
| 3,816,702 | 6/1974 | Green | 219/413 |
| 3,887,785 | 6/1975 | Ahlport | 219/209 |
| 4,284,872 | 8/1981 | Graeme | 219/209 X |

FOREIGN PATENT DOCUMENTS 661523 5/1979 U.S.S.R. ................ 219/210

*Primary Examiner*—Volodymyr Y. Mayewsky
*Attorney, Agent, or Firm*—W. G. Christoforo; Bruce L. Lamb

[57] ABSTRACT

An electronic package is mounted by its leads in an inner hermetically sealed package in an atmosphere of dry nitrogen gas at about 50 torr gas pressure. Leads extend through hermetically sealed electric feed-throughs into an outer enclosure which is maintained at a vacuum of at least $1 \times 10^{-4}$ torr. Electrical leads which extend substantially the entire length of the interior space of the outer enclosure pass out of the outer enclosure at first ends of the leads through hermetically sealed electrical feed-throughs and at second ends electrically communicate with and structurally support the leads from the inner enclosure so that the inner enclosure is disposed between the first and second ends. The surfaces of the inner enclosure and the interior surface of the outer enclosure are electropolished.

The electronic package consists of a central core sandwiched between beryllium oxide heat spreaders on which are mounted heaters in the form of power transistors. This structure is in turn sandwiched between ceramic substrates. The most heat sensitive circuit elements are mounted in the central core, while additional circuitry including controls for the power transistors is mounted on the substrates.

A support bridge designed to provide shock and vibration support for the inner enclosure while at the same time affording minimum heat transfer therefrom is disposed at the second ends.

16 Claims, 6 Drawing Figures

HOUSING AND MOUNTING ASSEMBLY PROVIDING A TEMPERATURE STABILIZED ENVIRONMENT FOR A MICROCIRCUIT

BACKGROUND OF THE INVENTION

This invention relates to a housing and mounting assembly providing a temperature stabilized environment for a microcircuit and more particularly to miniaturized means for stabilizing the temperature of a crystal oscillator circuit including a frequency determining crystal.

The temperature dependence of piezoelectric crystals and consequently of the circuits they control is well known. For example, the frequency of crystal controlled oscillators is normally temperature sensitive basically because the resonant frequency of the frequency determining crystal is extremely temperature dependent. Since in many applications it is desired that crystal oscillator frequency be more stable than is possible if the frequency determining crystal is exposed to the expected range of ambient temperatures, the crystal is temperature stabilized by placing it in a temperature controlled oven which provides an artificial but relatively temperature stable environment for the crystal. When very tight frequency control is desired tight and stable temperatures of the circuit are required. Means for maintaining tight and stable temperatures have generally been relatively large and heavy power consumers so that they are unattractive for portable or other use where size and power consumption are important. Attempts to miniaturize housing for such circuits have generally resulted in devices having little resistance to shock and vibration forces and thus still not completely suitable for use in portable or transportable equipment.

SUMMARY OF THE INVENTION

The present invention is a housing and mounting assembly providing a temperature stabilized environment for a microcircuit contained in an electronic package which includes means for sensing the temperature of the package and a heater in the form of power transistor means responsive to the sensed temperature for controlling the temperature of the electronic package. The package is disposed in a hermetically sealed inner enclosure on electrical leads which extend through hermetically sealed feedthroughs in the wall of the inner enclosure. An outer enclosure includes electrical leads which extend from first ends exterior to the outer enclosure through hermetically sealed feedthroughs in the wall of the outer enclosure substantially the entire length of the interior of the outer enclosure to second ends. The second ends are electrically and structurally connected respectively to the electrical leads of the inner enclosure so that the inner enclosure is disposed within the outer enclosure substantially between the first and second ends of the outer enclosure electrical leads.

Pinch-off tubulations are provided for both the inner and outer enclosures to permit the inner enclosure to be back-filled with dry nitrogen at about 50 torr and to permit the inner enclosure to be evacuated to a high vacuum. A vacuum getter is provided in the space between the inner and outer enclosures to maintain the high vacuum.

A support bridge across the second ends of the outer enclosure electrical leads provides support against shock and vibration forces for the inner enclosure. The bridge is a wafer having at the periphery a plurality of radially outwardly extending protrusions having relatively narrow tips sized to slightly interfere with the inner surface of the outer enclosure to provide support against vibration forces. These protrusions are alternately spaced with broader protrusions which slightly clear the inner surface of the outer enclosure. When subjected to heavy shock forces the relatively narrow protrusions flex so that the broad protrusions come into contact with the inner surface to provide additional support.

An object of the invention is to provide a temperature stabilized microcircuit contained in an electronic package having high resistance heat conductivity, convection and radiation paths to the outside environment.

Another object of the invention is to provide support against shock and vibration forces for the above mentioned electronic package.

DESCRIPTION OF THE PREFERRED EMBODIMENT

Figure 1:
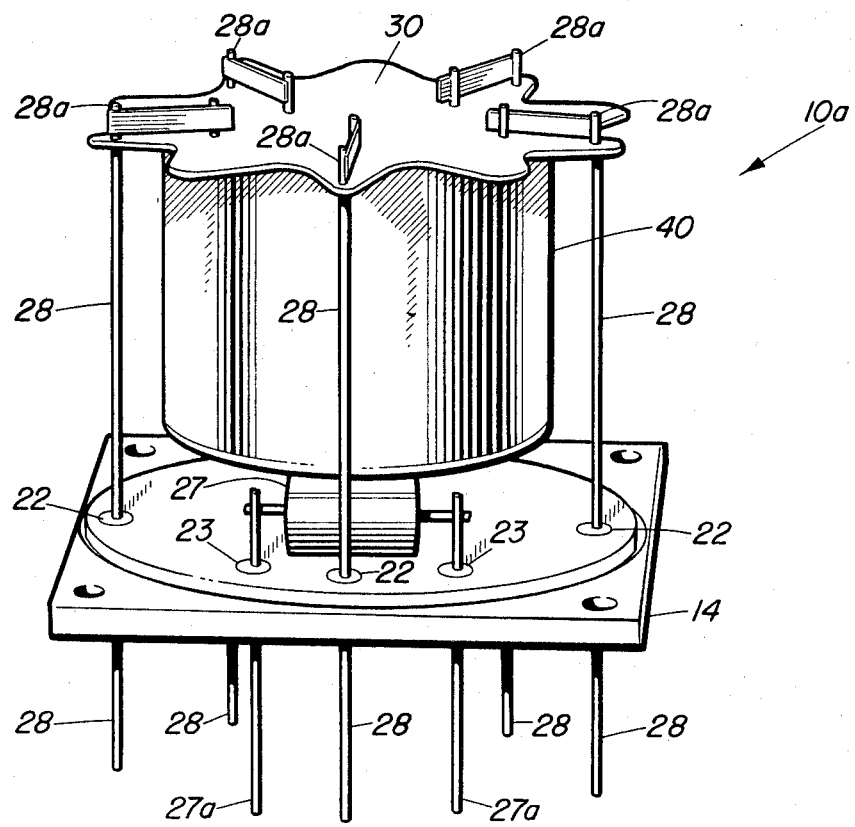
FIG. 1 is an isometric view of a housing and mounting assembly for a temperature controlled microcircuit, and particularly a crystal oscillator, made according to the present invention but having the outer enclosure removed.

Refer first to FIG. 1 which is an isometric view of a housing and mounting assembly for a temperature stabilized microcircuit, and particularly a crystal controlled oscillator, built according to the principle of this invention but with its outer cover removed and indicated at 10a. The device is comprised of a header 14 which has five feedthroughs 22 (only three of which are here visible) arranged equally spaced on said header. Two additional feedthroughs 23 located inward of feedthroughs 22 support and permit energizing vacuum getter and heater package 27 from an external source (not shown) via leads 27a. Five electrical leads 28, preferable of Inconel alloy, are provided in feedthroughs 22. Inconel is a trademark of The International Nickel Co., Inc. of Huntington, West Virginia. Suspended from leads 28 at ends 28a is a structure comprised of a structural support bridge 30 and inner enclosure 40 which is hermetically sealed, the interior of inner enclosure 40 having been evacuated by a high vacuum source (not shown) through tubulation 48, (FIG. 3).

Figure 2:
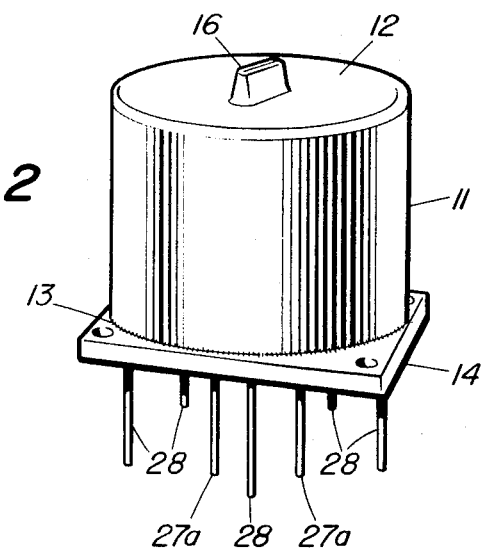
FIG. 2 is an isometric view of the device of FIG. 1 with the outer enclosure present.
Figure 3:
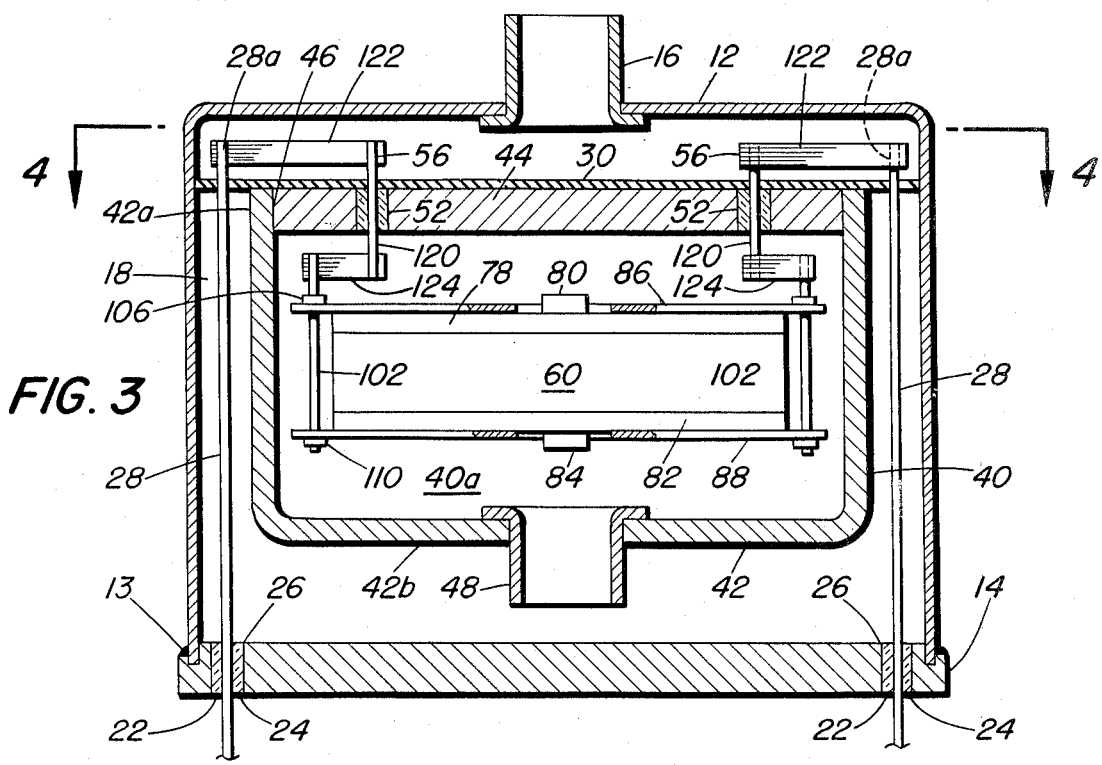
FIG. 3 is a longitudinal sectional view of the device of FIG. 2.

The assembly of the present invention is described in greater detail below where FIGS. 2 and 3 are, respectively, an isometric view of crystal oscillator 10 built according to the present invention and a longitudinal sectional view of the same oscillator. Oscillator 10 consists of an outer shell 11 comprised of a Kovar alloy cyclindrical case or cover 12 and Kovar alloy header 14. Kovar is the trademark of the Carpenter Technology Corp. of Reading, Pennsylvania. Kovar alloy is a nickel-iron-cobalt alloy which is the metal that has been successfully used in the art for hermetic ceramic-to-metal and glass-to-metal seals as the thermal expansion coefficients for Kovar alloy, ceramic and glass are essentially identical up to about 450° C. and thus readily accepts hermetically sealed electrical feedthroughs such as here required. Cover 12 includes an oxygenfree high conductivity copper tubulation 16 brazed into a hole in the center top thereof. Tubulation 16 is provided for the usual reason, that is, after assembly of oscillator 10 tubulation 16 is connected to a source of high vacuum and a high vacuum drawn in volume 18, which is the space interior to cover 12 but exterior to inner enclosure 40, and then the tubulation is pinched-off to trap the vacuum therein. More of this process of obtaining a vacuum in volume 18 will be said below. FIG. 2 shows tubulation 16 pinched-off while FIG. 3 shows tubulation 16 before it is pinched-off.

Cover 12 is vacuum welded to header 14 along annular seam 13. Header 14 includes conventional hermetically sealed electrical feedthroughs 22, each of which is comprised of a ceramic bead 24 sealed into hole 26 by brazing to header 14, and an electrical lead 28 protruding through and hermetically sealed, also by brazing, to bead 24.

Figure 4:
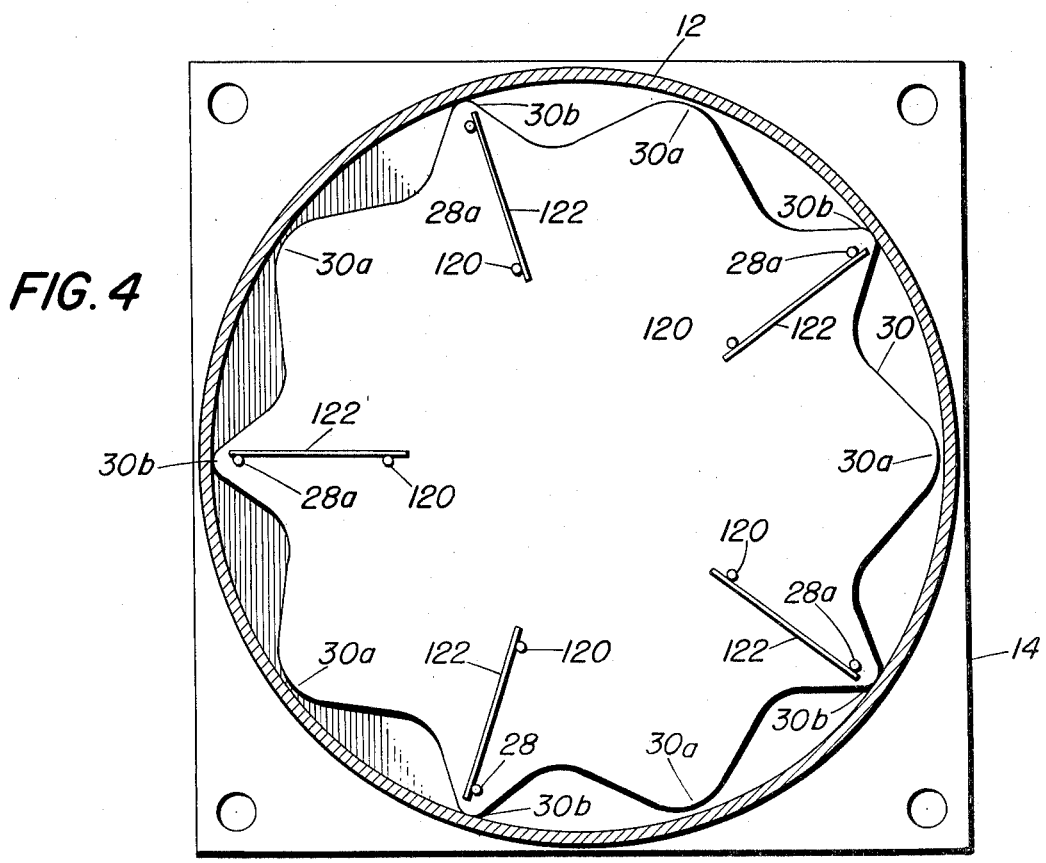
FIG. 4 is a sectional view taken along line 4—4 of FIG. 3.

Refer now to FIGS. 3 and 4, where FIG. 4 is a sectional view of the oscillator of the previous figures taken along line 4—4 of FIG. 3. The ends 28a of leads 28, that is the ends opposite header 14, extend through holes in and are spaced and supported by bridge 30, which is a relatively thin modified wafer-shaped structure which includes broad radial protrusions 30a which alternate with relatively sharper radial protrusions 30b. As seen in FIG. 4, bridge 30 is intended to fit into cover 12 so that there is a small clearance between the tips of broad protrusions 30a and the inside of cover 12 but so that there is a slight interference between tips of protrusions 30b and the inside of cover 12. This interference fit provides support for inner enclosure 40 against the effects of mechanical shock and vibration. Inner enclosure 40, which contains the oscillator and heat control circuitry as will be fully explained below, is otherwise carried by leads 28 through bridge 30. Protrusions 30b are designed to be relatively acute to reduce the efficiency of the conductive heat flow path between bridge 30 and cover 12. Broad protrusions 30a which, as has been discussed above, are designed not to touch cover 12 normally, are included to ensure protection of the electronic circuitry of inner case 40 in the event higher mechanical shock forces are encountered. In other words, if high mechanical shock forces are encountered protrusions 30b will flex or bend somewhat so that protrusions 30a come into momentary contact with the inner surface of cover 12 to provide additional support against the shock forces.

Bridge 30 is suitably made of Vespel polyimide, which is a low thermal conductivity, high service temperature and low outgassing dielectric. Vespel is a trademark of the E. I. DuPont de Nemours Co., Inc. of Wilmington, Delaware. In this embodiment Vespel bridge 30 is about 0.040 cms thick.

Inner enclosure 40, which contains an electronic circuitry package generally indicated at 60, is comprised of cylindrical inner cover 42 and header 44, both of which are made of Kovar alloy. An open end 42a of cover 42 is welded to header 44 along annular seam 46 to form a hermetic seal. A closed end 42b of cover 42 has an oxygen-free high conductivity copper tubulation 48 brazed into a centrally located hole. The purpose of tubulation 48 is somewhat similar to the purpose of tubulation 14 described above. That is, after electronic circuitry package 60 has been assembled onto header 44, as will be explained below, and cover 42 welded in place, tubulation 48 is connected to a source of high vacuum and a high vacuum drawn on the volume 40a inside inner enclosure 40. This outgasses the materials inside inner enclosure 40. Subsequently volume 40a is back-filled with dry nitrogen gas at about 50 torr and then tubulation 48 is pinched-off. Tubulation 48 is shown pinched-off in the figures.

Header 44 includes 5 electrical feedthroughs 50 (only 2 of which are seen in FIG. 3) equally spaced on a circle whose center is the center of header 44 and each comprised of a ceramic bead 52 brazed into a hole in the header. Each feedthrough 50 includes an electrical lead 56 hermetically brazed into a central hole in ceramic bead 52.

Figure 5:
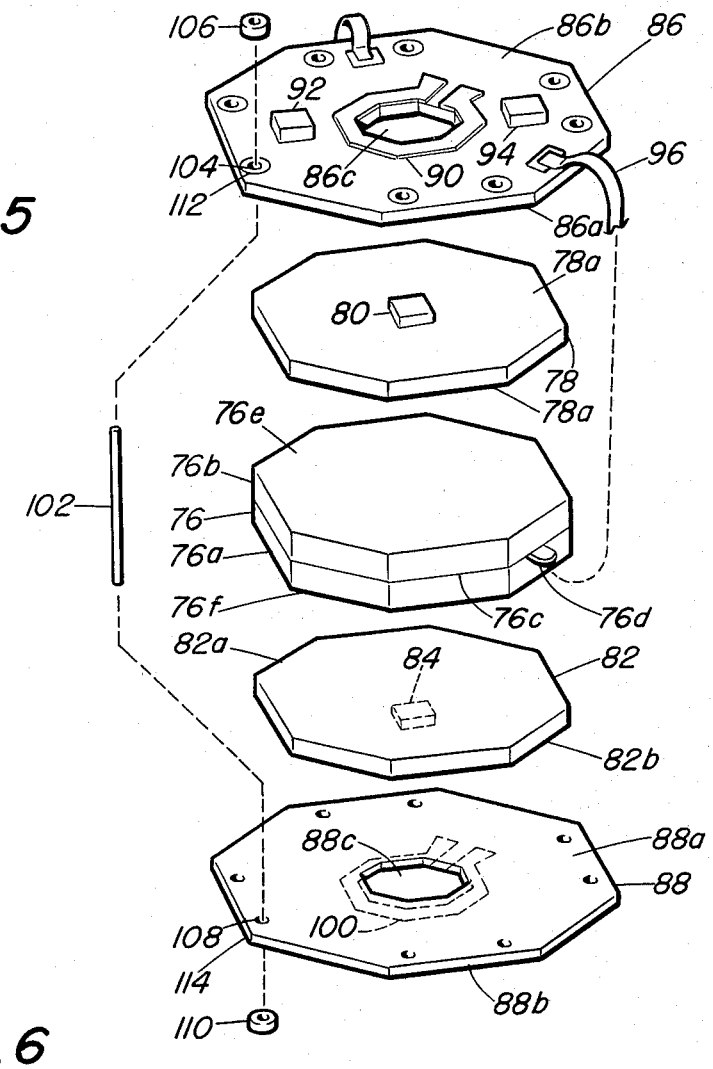
FIG. 5 is an exploded view of the electronic package.

As mentioned, electronic package 60 is mounted inside inner enclosure 40. Refer now to FIG. 5 which shows electronic package 60 exploded. In this embodiment the electronic package comprises a crystal controlled oscillator wherein a precision quartz crystal, which is the basic frequency determining element of the oscillator, is packaged in a standard ceramic flatpack 76, which is simply a hollow ceramic capsule having an octagonal outline and comprised of two halves, 76a and 76b, into which the crystal is mounted on standard shock mounts and the two halves bonded together along seam 76c in a nitrogen atmosphere of about 50 torr pressure. Electrical communication is made to the crystal through a tab 76d and a second tab (not seen) on the opposite side of flatpack 76. Flatpack 76 is sandwiched between two beryllium oxide heat spreaders 78 and 82. Power transistors 80 and 84 are eutectically bonded respectively to the center of the heat surfaces 78a and 82b. Power transistors 80 and 84 comprise the heat sources for the steady state heating of the electronic package including flatpack 76 and hence for the crystal mounted therein and substrates 86 and 88. Briefly, heat dissipated in power transistors 80 and 84 is distributed evenly by heat spreaders 78 and 82 over the upper and lower surfaces of flatpack 76 and also to ceramic substrates 86 and 88.

The electronic package is completed by ceramic substrates 86 and 88 which sandwich the assembly of heat spreaders 78, 82 and flatpack 76. The contacting surfaces of the elements of FIG. 5 already discussed, that is surfaces 86a, 78a, 78b, 76e, 76f, 82a, 82b and 88a, are metallized and the complete sandwich assembled by brazing the various surfaces to one another. This technique optimizes heat flow between the elements. Note that when the sandwich is complete power transistor 80 and 84, respectively, protrude into holes 86c and 88c of substrates 86 and 88.

The remainder of the oscillator circuitry is mounted on surface 86b of substrate 86. This circuitry, which includes microstrip tracks, is not shown in detail but is represented by boxes 92 and 94. Electrical communication between flatpack 76, and in particular the crystal mounted therein, and the remainder of the oscillator circuitry is provided by conductive foil strips 96 and 98 connected between substrate 86 and respectively tab 76d and the unseen tab. In addition there is included on surface 86b of substrate 86 a resistive track 90 disposed about hole 86c. A similar resistive track 100 is disposed on surface 88b of substrate 88 about hole 88c. These resistive tracks comprise relatively large heating elements which are used to provide initial warm-up for the electronic package. Circuitry for controlling initial warm-up heating elements 90 and 100 as well as steady state heating power transistors 80 and 84 is generally arranged on surface 88b of substrate 88.

Electrical communication between the circuits on surfaces 86b and 88b of substrates 86 and 88 as well as electrical communication from the electronics package through header 44 to leads 28 of FIG. 2 is provided by eight leads 102, only one of which is shown in FIG. 5 for clarity. Leads 102 are connected, for example, through holes 104 and 108, respectively, in substrates 86 and 88 and secured at either end by collars 106 and 110 which are welded to lead 102 and soldered to pads 112 and 114. In this embodiment five leads 102 are connected to header 44 and three leads 102 are used only for communication between substrates 86 and 88.

As mentioned above, electrical communication to electronic package 60 is through five electrical leads. Returning to FIGS. 3 and 4, these leads comprise the leads 28 which extend through header 4 to ends 28a, five leads 120 which extend through header 44 and the five leads 102 of electronic package 60. Leads 28 are respectively connected to leads 120 through flat strips of Kovar alloy 122 welded to each lead. In like manner, leads 120 are connected to leads 102 through flat strips of Kovar alloy 124. It can be seen that the electronic package is, in effect, mounted on five electrical leads each comprised of, in turn, lead 28, strip 122, lead 120, strip 124 and lead 102. These leads comprise the major conductive heat path between electronic package 60 and the external environment. Thus, these leads are made as long as possible, as shown, to provide a high resistance heat path.

As might be expected, the electronic circuitry is relatively dirty, when considered in a vacuum technology sense, and would thus outgas and destroy any vacuum in which it might be disposed. For this reason electronic package 60 is contained within inner enclosure 40 which is back-filled with dry nitrogen gas at about 50 torr when tubulation 48 is pinched-off.

In order to attenuate radiant heat transfer between electronic package 60 and the environment all surfaces of inner enclosure cover 42 and header 44 as well as the inner surfaces of cover 12 and header 14 are preferably electropolished. In addition, in order to attenuate convective heat transfer the vacuum in volume 18 is kept at at least $1 \times 10^{-4}$ torr. This vacuum is achieved by initially drawing a vacuum of about $1 \times 10^{-9}$ torr in volume 18 when tubulation 16 is pinched-off. The vacuum is maintained by the above mentioned getter 27 which, in the present embodiment, is a zirconium/graphite getter having an internal heating element to activate and regenerate the getter material. The actual getter used is a model ST-172 getter marketed by S.A.E.S. of Colorado Springs, Colorado. This getter is activated at 450° C. and can be reactivated by reheating at 450° C. This feature is particularly attractive if the vacuum degenerates. The getter heater is energized through leads which extend through header 14 as seen in FIG. 1.

Figure 6:
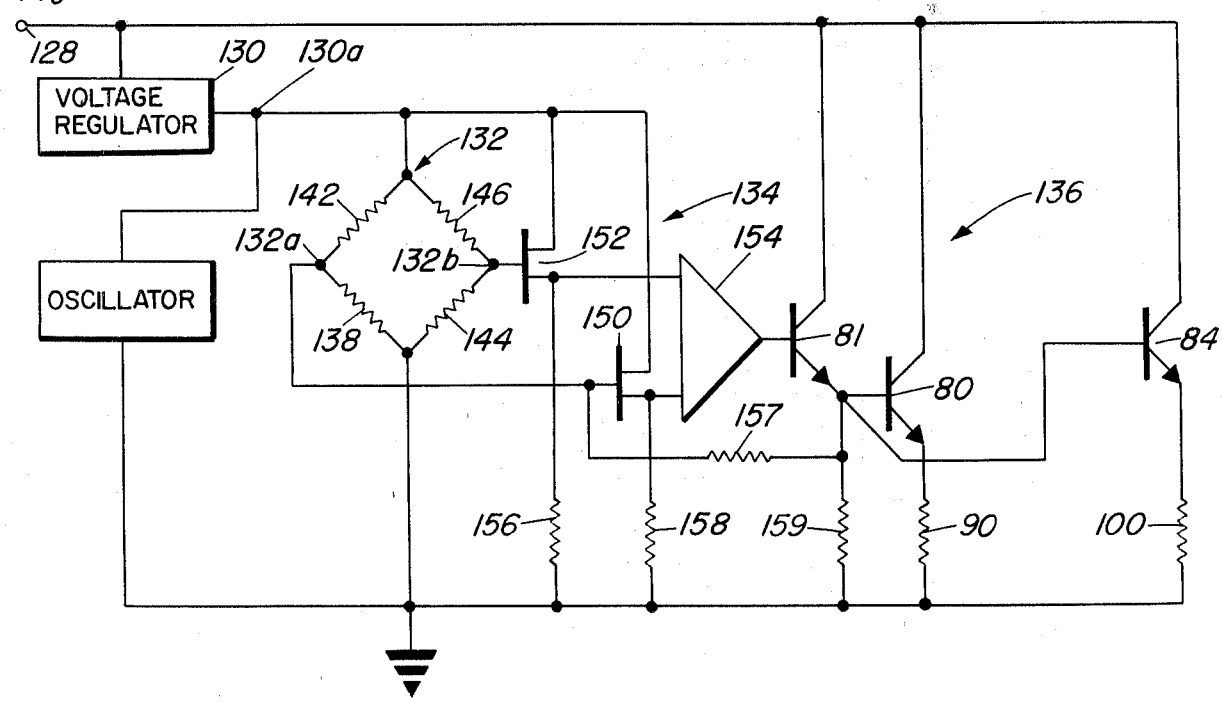
FIG. 6 is a schematic of the heater and control circuitry.

Refer now to FIG. 6 which is a schematic diagram generally of the heating circuit. The circuit receives an unregulated 12 volts at terminal 128 which is regulated to 9 volts at terminal 130a by voltage regulator 130. Terminal 130a supplies regulated power to the oscillator circuit (not shown) and also to the heating circuit comprised of temperature responsive bridge 132, voltage amplifier 134 and heater 136. Temperature responsive bridge 132 consists of resistors 138, 144 and 146, each comprising respectively one arm of the bridge, and negative coefficient thermistor 142 which comprises the fourth arm of the bridge. The bridge is sensed at diagonal points 132a and 132b which are respectively connected to the gate electrodes of low noise FETs 150 and 152, which together with differential amplifier 154 comprise voltage amplifier 134. These transistors have their source electrodes commonly connected to regulated voltage terminal 130a and their drain electrodes respectively connected to the input terminals of differential amplifier 154. The drain electrodes are also respectively connected to ground through resistors 156 and 158. Heater 136 is comprised of transistor 81 which responds to the output signal from differential amplifier 154 at its base electrode to drive power transistors 80 and 84 whose base electrodes are connected in common to the emitter electrode of drive transistor 81. The collector electrodes of power transistors 80 and 84 are connected to unregulated power terminal 128 and the emitter electrodes are connected respectively through resistors 90 and 100 to ground. Power transistors 80 and 84 as well as resistors 90 and 100 are also seen in FIG. 5. It will be remembered that resistors 90 and 100 are embodied in FIG. 5 as large heater resistors. When bridge 132 is relatively unbalanced the main heat is provided by resistors 90 and 100. However, as the bridge becomes balanced at the steady state operating condition of the microcircuit the main heating is provided by power transistors 80 and 84. Feedback is provided by resistor 157 connected between the emitter electrode of transistor 81 and the gate electrode of transistor 150.

In an embodiment of the invention actually built it was found that one power transistor and its connected heater resistor was not required and actuallly the microcircuit, which was in the form of a modified Colpitts oscillator, exhibited tighter frequency control with only a single power transistor and heater resistor. In that case power transistor 80 and resistor 90 were removed from the circuit.

In the unit actually built the outer enclosure measured about 3.2 cm diameter by 2.5 cm long. The inner enclosure measured about 2.4 cm diameter by 1.5 cm long. As mentioned above, the microcircuit actually built was a modified Colpitts oscillator in that the frequency determining crystal was arranged in a modified Colpitts configuration with amplitude controlled by a detector driven current source which controlled the oscillator transistor $g_m$. The oscillator output frequency was available through a cascode buffer for good load isolation. The unit operated in an ambient of −55° C. to +75° C., while the temperature of the electronics package was maintained at +95° C. over that entire range. At the lower temperature of −55° C. the unit drew 250 milliwatts during steady state operation for both the heater and oscillator circuits.

Having described the above embodiment of my invention one skilled in the art should now be able to make modifications and alterations thereof. Accordingly, I claim as my invention the subject matter covered by the true spirit and scope of the appended claims.

The invention claimed is:

1. A housing and mounting assembly providing a temperature stabilized environment for a microcircuit, comprising: a hermetically sealed outer enclosure having a plurality of electrical feedthroughs including a plurality of electrical leads, each said electrical lead extending from a first end exterior to said outer enclosure through a feedthrough and extending a substantial distance into the interior space of said outer enclosure to a second end;

an inner enclosure having a plurality of electrical feedthroughs including a plurality of electrical leads protruding therethrough to electrically communicate between the exterior and interior of said inner enclosure;

means electrically and structurally connecting said second ends respectively to the ends of said inner enclosure electrical leads exterior to said inner enclosure so that said inner enclosure is disposed within said outer enclosure substantially between said first and second ends;

mounting means supporting said microcircuit, said mounting means including a substrate, and means for sensing the temperature of said substrate, said mounting means being disposed inside said inner enclosure and supported by said inner enclosure electrical leads; and means controlled by said temperature sensing means for heating the heat spreader means of said substrate.

2. The assembly of claim 1 wherein the interior space of said outer enclosure exterior to said inner enclosure is at a high vacuum.

3. The assembly of claim 2 including a vacuum getter disposed in the space between said outer and inner enclosures.

4. The assembly of claim 3 wherein said vacuum getter includes heater means for reactivating said vacuum getter.

5. The assembly of claim 4 wherein the interior surface of said outer enclosure and the exterior surface of said inner enclosure are electropolished.

6. The assembly of claim 1 wherein the interior space of said inner enclosure is hermetically sealed and filled with dry nitrogen gas at about 50 torr gas pressure.

7. The assembly of claim 1 including a bridge spanning said second ends, said bridge being a wafer-shaped structure having a plurality of radially outwardly extending protrusions at the periphery of said wafer, a first group of said protrusions having relatively narrow tips sized to interfere slightly with the inner surface of said outer enclosure and a second group of said protrusions being sized to slightly clear the inner surface of said outer enclosure.

8. A housing and mounting assembly providing a temperature stabilized environment for a microcircuit, comprising: a hermetically sealed outer enclosure having a plurality of electrical feedthroughs including a plurality of electrical leads, each said electrical lead extending from a first end exterior to said outer enclosure through a feedthrough and extending a substantial distance into the interior space of said outer enclosure to a second end;

an inner enclosure having a plurality of electrical feedthroughs including a plurality of electrical leads protruding therethrough to electrically communicate between the exterior and interior of said inner enclosure;

means electrically and structurally connecting said second ends respectively to the ends of said inner enclosure electrical leads exterior to said inner enclosure so that said inner enclosure is disposed within said outer enclosure substantially between said first and second ends;

mounting means for said microcircuit including a hollow central core for containing said microcircuit, said core having planar top and bottom surfaces, top and bottom heat spreader means sandwiching said core and in intimate contact with said top and bottom surfaces of said core, means for sensing the temperature of said mounting means; and means controlled by said temperature sensing means for heating said heat spreader means.

9. The assembly of claim 8 wherein said heat spreader means comprises beryllium oxide high heat conductive means.

10. The assembly of claim 8 wherein said microcircuit includes a crystal controlled oscillator having at least a frequency determining crystal mounted in said central core.

11. The assembly of claim 10 wherein said central core sandwiched between heat spreader means is additionally sandwiched by substrate means on which is mounted at least a portion of said crystal controlled oscillator and said means for sensing the temperature of said mounting means and with, additionally means electrically communicating said frequency determining crystal with the portion of said crystal controlled oscillator mounted on said substrate means.

12. The assembly of claim 11 wherein the space between said outer and inner enclosures is at a high vacuum.

13. The assembly of claim 12 including a vacuum getter disposed in the space between said outer and inner enclosures.

14. The assembly of claim 13 wherein said vacuum getter includes heater means for reactivating said vacuum getter.

15. The assembly of claim 14 wherein the interior surface of said outer enclosure and the exterior surface of said inner enclosure are electropolished.

16. The assembly of claim 15 wherein said inner enclosure is hermetically sealed and filled with dry nitrogen at about 50 torr gas pressure.

* * * * *